(12) United States Patent
Takagi

(10) Patent No.: US 7,165,897 B2
(45) Date of Patent: Jan. 23, 2007

(54) OPTICAL MODULE

(75) Inventor: Shinichi Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 146 days.

(21) Appl. No.: 10/327,928

(22) Filed: Dec. 26, 2002

(65) Prior Publication Data

US 2003/0123820 A1 Jul. 3, 2003

(30) Foreign Application Priority Data

Dec. 28, 2001 (JP) .......................... 2001-401464

(51) Int. Cl.
*G02B 6/36* (2006.01)

(52) U.S. Cl. .................. 385/92; 250/239; 385/49
(58) Field of Classification Search .............. 385/49, 385/88–94; 250/239
See application file for complete search history.

(56) References Cited

U.S. PATENT DOCUMENTS

| | | | | | |
|---|---|---|---|---|---|
| 3,773,289 | A | * | 11/1973 | Gloge | 257/466 |
| 4,069,095 | A | * | 1/1978 | Lorenze et al. | 438/66 |
| 4,729,623 | A | * | 3/1988 | Mery | 385/91 |
| 5,064,992 | A | * | 11/1991 | Jones et al. | 219/121.63 |
| 5,156,999 | A | * | 10/1992 | Lee | 438/25 |
| 5,179,609 | A | * | 1/1993 | Blonder et al. | 385/89 |
| 5,181,216 | A | * | 1/1993 | Ackerman et al. | 372/36 |
| 5,200,612 | A | * | 4/1993 | Moriya et al. | 250/239 |
| 5,216,248 | A | * | 6/1993 | Ikeda et al. | 250/237 R |
| 5,406,065 | A | * | 4/1995 | Jacksen | 250/208.1 |
| 5,428,704 | A | * | 6/1995 | Lebby et al. | 385/92 |
| 5,694,048 | A | * | 12/1997 | Boudreau et al. | 324/752 |
| 5,801,402 | A | * | 9/1998 | Shin | 257/80 |
| 5,812,581 | A | * | 9/1998 | Cox | 372/50.21 |
| 5,923,481 | A | * | 7/1999 | Skidmore et al. | 359/819 |
| 5,937,114 | A | * | 8/1999 | Fisher et al. | 385/14 |
| 6,632,029 | B1 | * | 10/2003 | Williamson et al. | 385/92 |
| 6,647,042 | B1 | * | 11/2003 | Miyachi et al. | 372/45 |
| 6,670,600 | B1 | * | 12/2003 | Terano et al. | 250/214.1 |
| 6,821,793 | B1 | * | 11/2004 | Verdonk et al. | 438/6 |
| 6,835,992 | B1 | * | 12/2004 | Swirhun et al. | 257/461 |
| 2003/0034438 | A1 | * | 2/2003 | Sherrer et al. | 250/216 |
| 2003/0231828 | A1 | * | 12/2003 | Brock et al. | 385/33 |
| 2004/0067025 | A1 | * | 4/2004 | Haraguchi et al. | 385/49 |
| 2004/0086231 | A1 | * | 5/2004 | Fukuyama et al. | 385/49 |
| 2004/0239931 | A1 | * | 12/2004 | Teichmann et al. | 356/328 |

* cited by examiner

*Primary Examiner*—Ellen E. Kim
(74) *Attorney, Agent, or Firm*—Bachanan Ingersoll & Rooney PC

(57) ABSTRACT

This optical module includes solder which solders an anode electrode of a PD element for detecting back light emitted from an LD element and wiring patterns, and solder which solders a cathode electrode and wiring patterns.

23 Claims, 18 Drawing Sheets

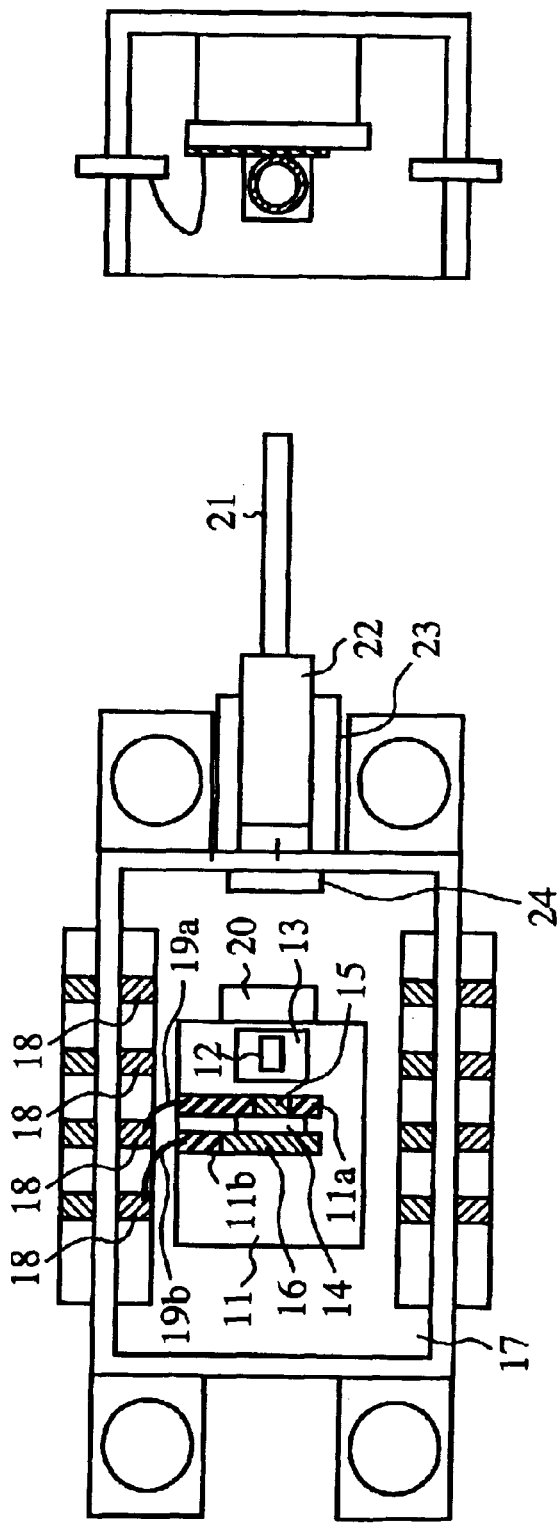

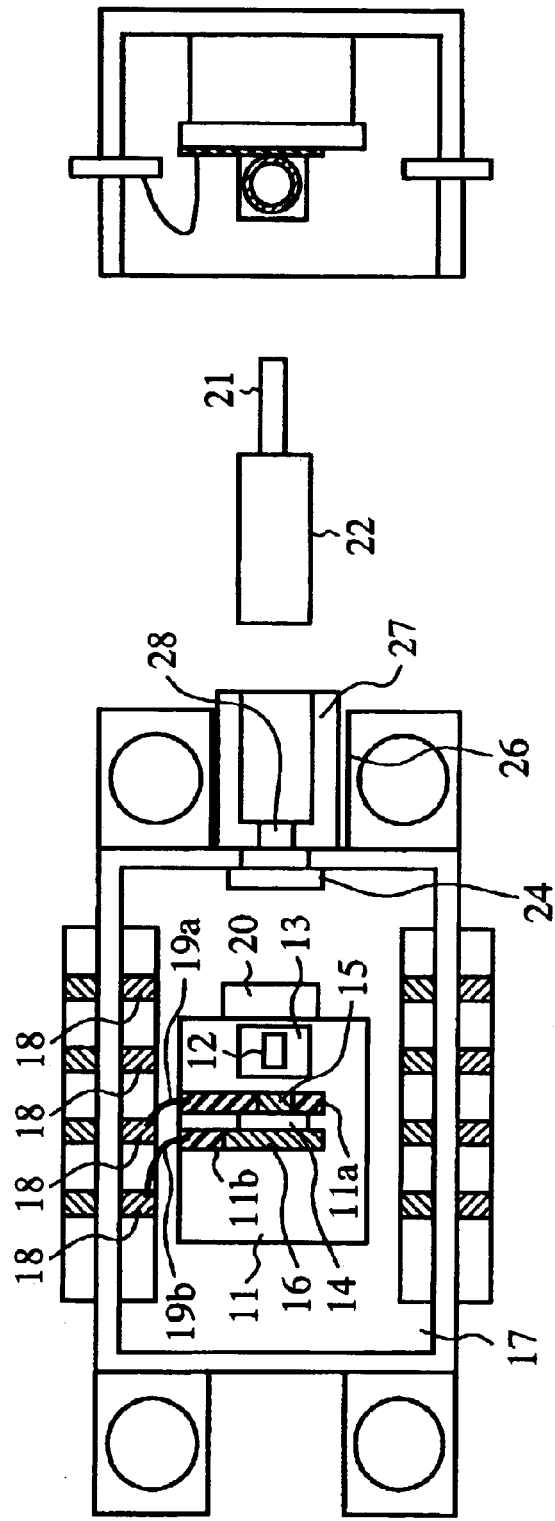

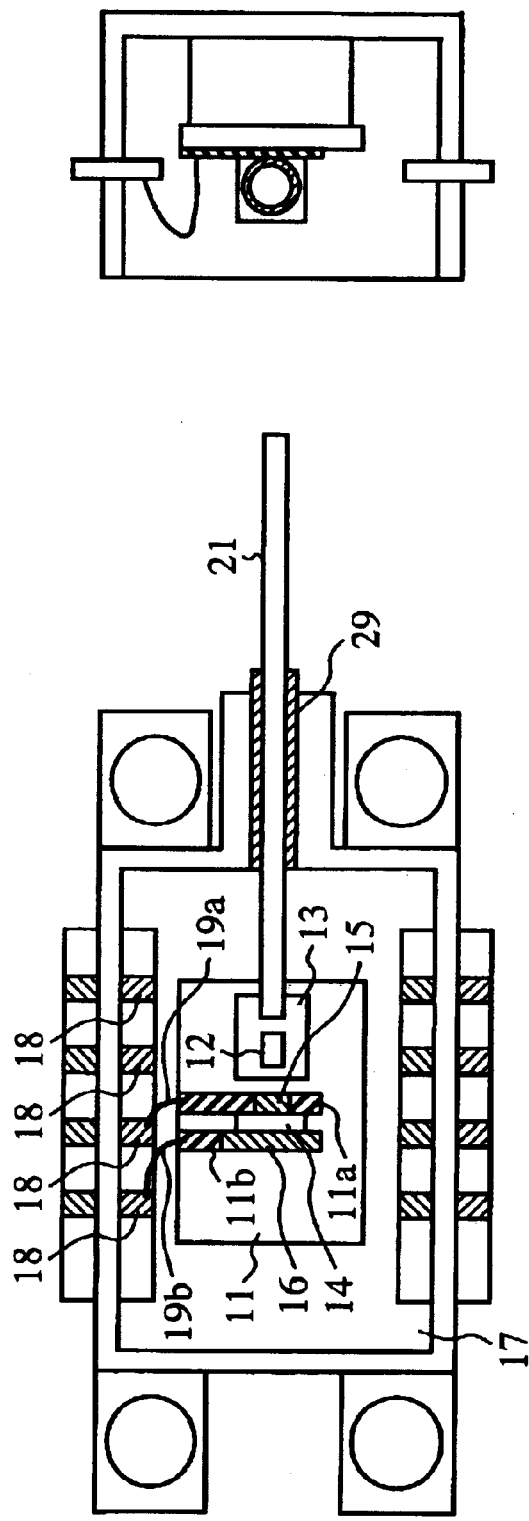

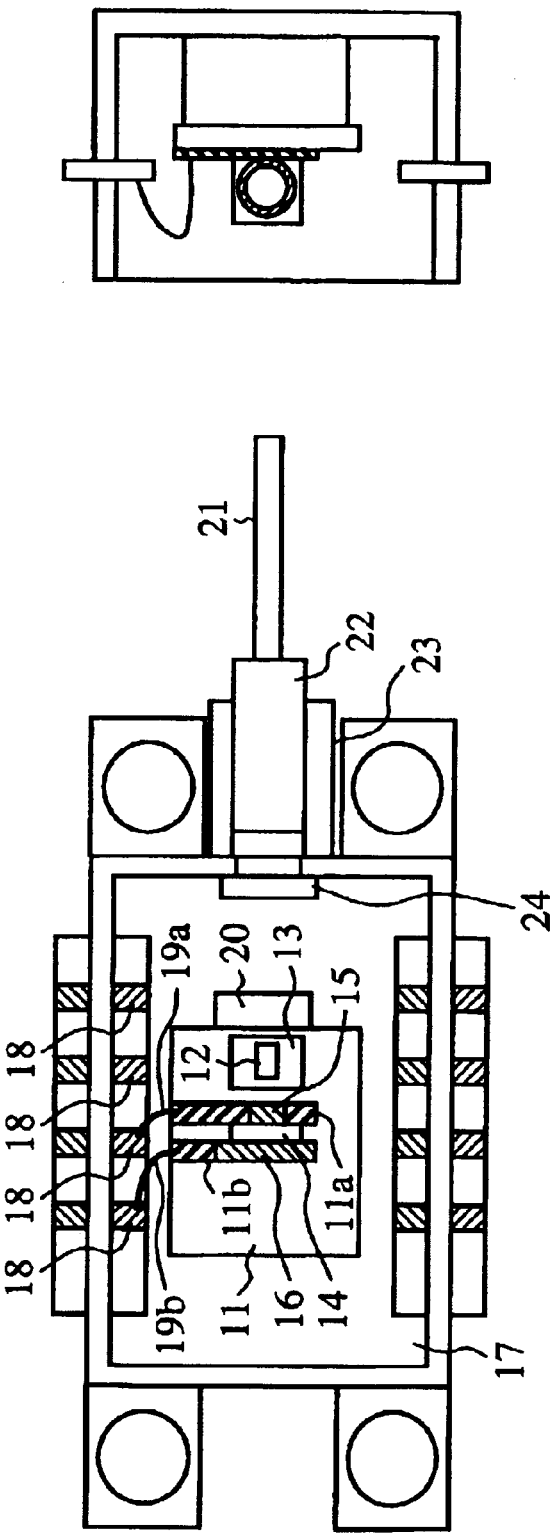

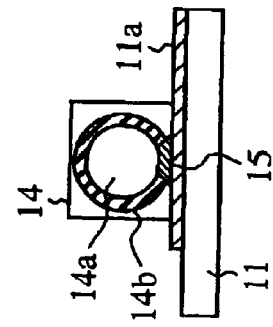
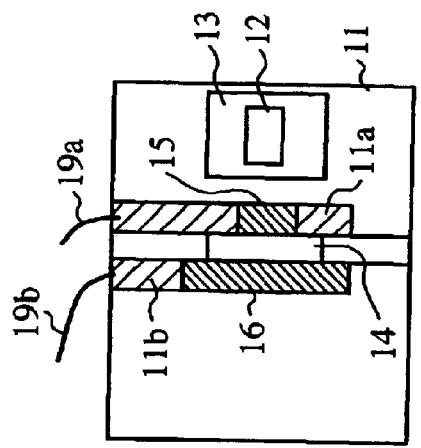
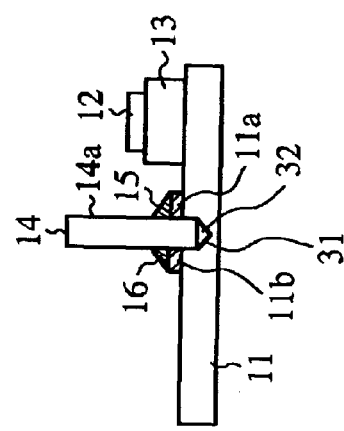
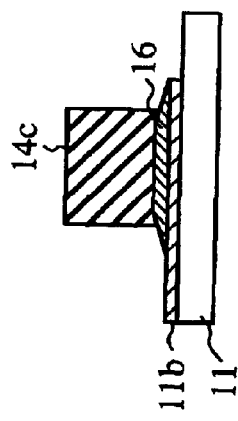

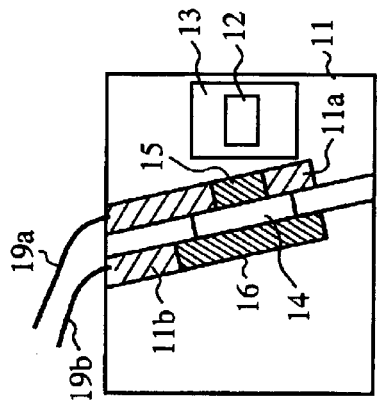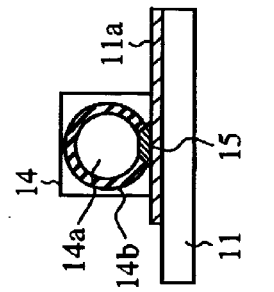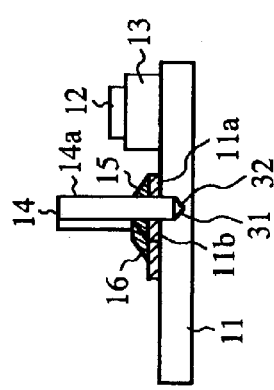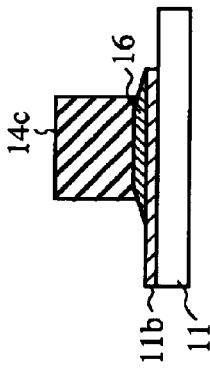

FIG.14A
FIG.14B
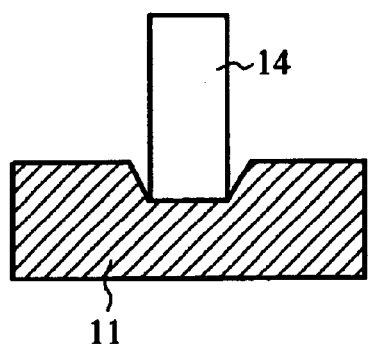
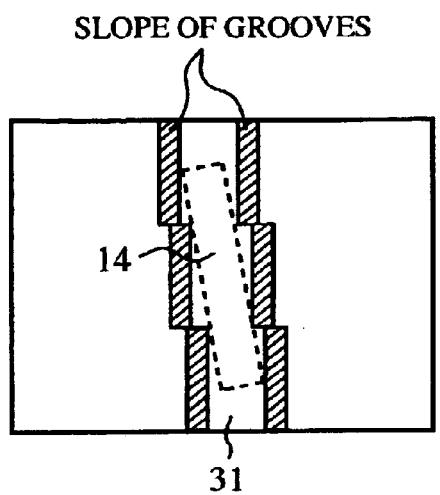
SLOPE OF GROOVES
FIG.15A
FIG.15B
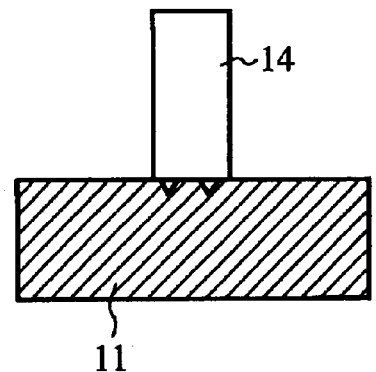
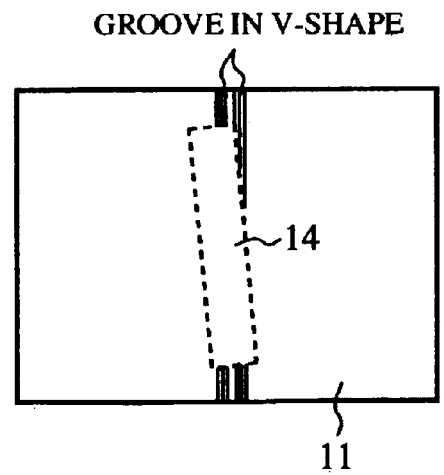
GROOVE IN V-SHAPE

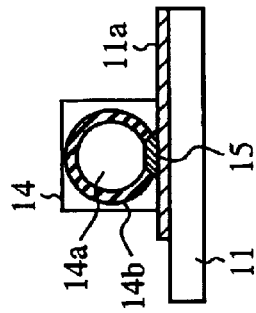
FIG.16A
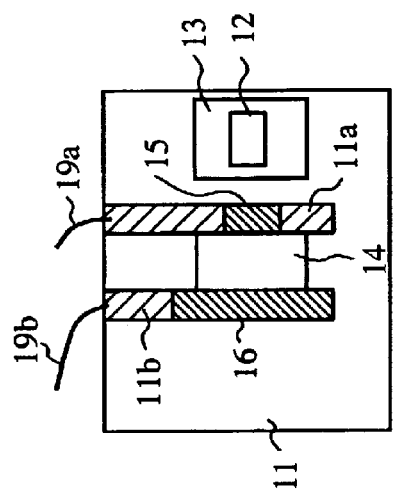
FIG.16C
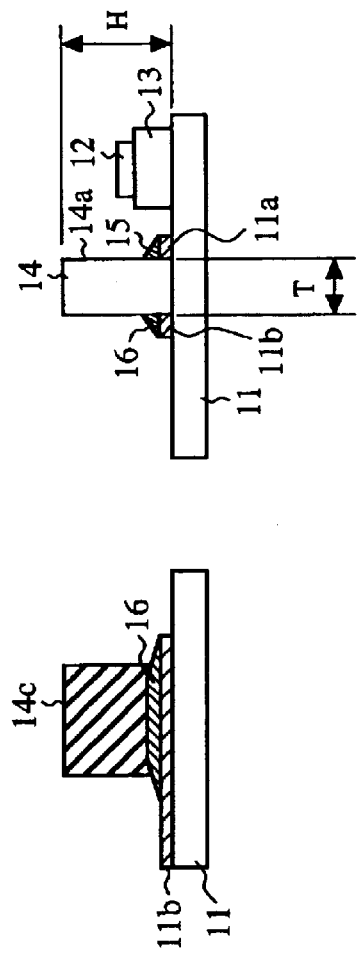
FIG.16D
FIG.16B

OPTICAL MODULE

BACKGROUND OF THE INVENTION

1. Field of the Invention

This invention relates to an optical module on which a radiative device and a photo detector for detecting emitted light or the like are mounted.

2. Description of Related Art

FIG. 22A is atop view showing a conventional optical module. FIG. 22B is a side view showing a conventional optical module. FIG. 22C is a front view showing a PD element.

Referring to FIGS. 22A through 22C, reference numeral 1 denotes a substrate on which an LD carrier 3 and a PD carrier are mounted, 2 a radiative device (hereinafter referred to as an LD element, not shown), 3 an LD carrier for holding thereon the LD element 2, 4 a photo detector (hereinafter referred to as a PD element) for detecting back light from the LD element 2, 4a an incident surface of the PD element, at the peripheral of which an anode electrode 4b is provided, and on the opposite surface of which a cathode electrode is provided. Reference numeral 5 denotes a PD carrier for holding thereon the PD element 4, 5a, 5b wiring patterns laid out on the PD carrier 5, 6 a wire bonding for electrically connecting the anode element 4b of the PD element 4 to the wiring pattern 5a, and 7, 8 wire bondings for electrically connecting wiring patterns of a package (not shown) which holds thereon the substrate 1 to the wiring patterns 5a, 5b.

In such an optical module, in case the magnitude of emitted light from the LD element 2 must be kept constant, for example, observing back light from the LD element 2 allows control of the LD element 2, as the magnitude of the back light is usually proportional to emitted light.

In order for the PD element 4 to detect back light from the LD element 2, the conventional optical module has been mounted the PD element 4 on the PD carrier 5 such that the incident surface 4a of the PD element 4 faces to the back of the LD element 2.

Outputting an electrical signal, which has a proportional relationship with back light from the LD element 2, of the anode electrode 4b of the PD element 4 and the cathode electrode, as shown in FIG. 22C, the anode electrode 4b is electrically connected to the wiring pattern 5a of the PD carrier 5 by the wire bonding. Further, the wiring patterns of the package (not shown) which holds thereon the substrate 1 are electrically connected to the wiring patterns 5a, 5b by the wire bondings 7, 8.

The conventional optical module thus configured as above involves numerous troublesome wire bonding processes required for manufacturing of an optical module. Further, the PD carrier has to be mounted to mount the PD element 4 on the substrate 1. Thus, this requirement invites a bulky and costly optical module, and asks for an additional mounting process for the PD carrier 5.

SUMMARY OF THE INVENTION

The present invention has been made to solve the above problems and an object thereof is to provide an optical module able to eliminate the PD carrier and simplify the manufacturing process.

According to the invention, there is provided an optical module in which an electrode of a photo detector for detecting emitted light from a radiative device is electrically connected to wiring patterns, and in which a conductive coupling member is provided for securing the photo detector to a base.

According to the invention, there is provided an optical module in which an electrode of a photo detector for detecting emitted light from an optical fiber is electrically connected to wiring patterns, and in which a conductive coupling member is provided for securing the photo detector to a base.

According to the invention, there is provided an optical module in which solder is applied to solder an electrode of a photo detector for detecting emitted light from an optical fiber and wiring patterns.

According to the invention, there is provided an optical module in which solder is applied to solder an electrode of a photo detector for detecting emitted light from a radiative device and wiring patterns.

According to the invention, there is provided an optical module in which a conductive adhesive is applied to adhere an electrode of a photo detector for detecting emitted light from a radiative device to wiring patterns.

According to the invention, there is provided an optical module in which a conductive adhesive is applied to adhere an electrode of a photo detector for detecting emitted light from an optical fiber to wiring patterns.

In the optical module, the dimension of a photo detector is determined so that the intensity center of emitted light substantially coincides with the center of an incident surface of the photo detector.

In the optical module, a slit is formed to insert thereinto a part of a photo detector.

In the optical module, the slit is formed in U-shape.

In the optical module, the slit is formed in V-shape.

In the optical module, the depth of the slit is set so that emitted light impinges on the center of the incident surface of the photo detector.

In the optical module, the incident surface of the photo detector stood on the slant relative to emitted light.

In the optical module, a stepwise slit whose center line is shifted in stages is formed on a base, into which a part of the photo detector is inserted.

In the optical module, two grooves are formed on the surface with which the photo detector is contacted.

In the optical module, the height of the photo detector is set to be smaller than twice of the width thereof.

In the optical module, an insulating layer is provided on the periphery of the incident surface of the photo detector.

In the optical module, an insulating film is coated on the circumference of the photo detector which is contacted with the base.

In the optical module, when a wire is laid out on one side of a couple of electrode layers of the photo detector, the wire is connected to the wiring patterns.

According to the invention, there is provided an optical module including a base on which wiring patterns are laid out, and an optical fiber for carrying front emitted light from the radiative device.

According to the invention, there is provided an optical module in which a package is provided to hold a base on which wiring patterns are laid out, and an optical fiber through which light to be impinged on the photo detector is carried.

In the optical module, holding means is provided for removably holding the optical fiber.

In the optical module, a lens is placed between the radiative device and the optical fiber.

In the optical module, a lens is placed between the optical fiber and the photo detector.

As described above, according to the present invention, since the electrode which detects emitted light from the radiative device is electrically connected to the wiring patterns and is provided with the conductive coupling member so as to secure the detecting device to the base, the detecting device can be mounted without relying on the PD carrier. As a result, this simplifies manufacturing processes.

The above and other objects and the attendant advantages of the invention will become readily apparent by referring to the following detailed description of the preferred embodiments when considered in conjunction with the accompanying drawings.

BRIEF DESCRIPTION OF THE DRAWINGS

FIG. 1 is an overall block diagram showing the optical module according to a first embodiment of the present invention.

FIG. 4 is an overall block diagram showing an optical module according to a second embodiment of the present invention.

FIG. 5 is an overall block diagram showing an optical module according to a second embodiment.

FIG. 8 is an overall block diagram showing an optical module according to a fourth embodiment of the present invention.

FIG. 10A is a top view showing a purview of an optical module according to a fifth embodiment of the present invention.

FIG. 10B is a rear view showing a PD element.

FIG. 10C is a side view showing a purview of an optical module.

FIG. 10D is a front view showing a PD element.

FIG. 12A is a top view showing a purview of an optical module according to a sixth embodiment of the present invention.

FIG. 12B is a rear view showing a PD element.

FIG. 12C is a side view showing an optical module.

FIG. 12D is a front view showing a PD element.

FIG. 14A is a side view showing a purview of an optical module according to a seventh embodiment of the present invention.

FIG. 14B is a top view showing a dielectric substrate.

FIG. 15A is a side view showing a purview of an optical module according to a eighth embodiment of the present invention.

FIG. 15B is a top view showing a dielectric substrate.

FIG. 16A is a top view showing a purview of an optical module according to a ninth embodiment of the present invention.

FIG. 16B is a rear view showing a PD element.

FIG. 16C is a side view showing a purview of an optical module.

FIG. 16D is a front view showing a PD element.

Throughout the figures, the same reference numerals, and characters, unless otherwise noted, are used to denote like features, elements, components, or portions of the illustrated embodiment.

DETAILED DESCRIPTION OF THE PREFERRED EMBODIMENTS

The preferred embodiments of the present invention will be described in detail, referring to the accompanying drawings.

First Embodiment

Figure 2A:
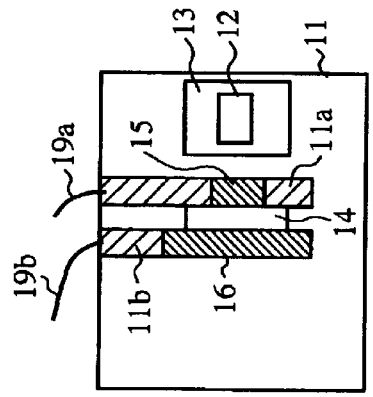
FIG. 2A is a top view showing a purview of the optical module according to a first embodiment.
Figure 2D:
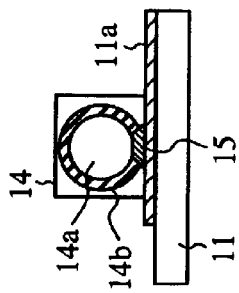
FIG. 2D is a front view showing a PD element.
Figure 2C:
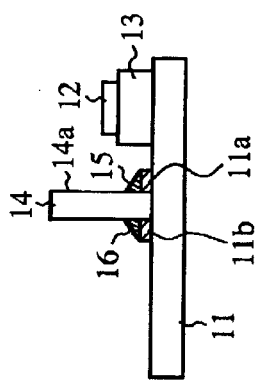
FIG. 2C is a side view showing a purview of the optical module.
Figure 2B:
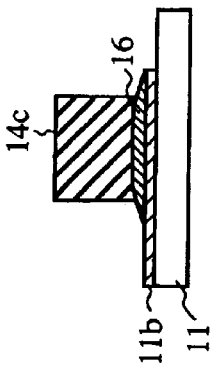
FIG. 2B is a rear view showing a PD element.

FIG. 1 is an overall block diagram showing an optical module according to the first embodiment of the present invention. FIG. 2A is a top view showing a purview of an optical module according to the first embodiment. FIG. 2B is a rear view showing a PD element. FIG. 2C is a side view showing a purview of an optical module. FIG. 2D is a front view showing a PD element.

Referring now to FIG. 1, FIGS. 2A through 2D, reference numeral 11 denotes a dielectric substrate (base) on which wiring patterns 11a, 11b are laid out, 12 an LD element (radiative device) for emitting light to an optical fiber 21, 13 an LD carrier for holding thereon the LD element 12, 14 a PD element (photo detector) for detecting back light (emitted light) emitted from the LD element 12, 14a an incident surface of the PD element 14, 14b an anode electrode provided at the periphery of the photo detector 14a, 14c a cathode electrode provided on the back of the PD element 14.

Reference numeral 15 denotes solder (conductive coupling member) for electrically connecting an anode electrode 14b of the PD element 14 to wiring patterns 11a of the dielectric substrate 11, and for securing the PD element to the dielectric substrate 11, 16 solder (conductive coupling member) for electrically connecting a cathode electrode 14c of the PD element 14 to wiring patterns 11b of the dielectric substrate 11, and for securing the PD element 14 to the dielectric substrate 11.

Reference numeral 17 denotes a package which holds thereon the dielectric substrate 11 and the optical fiber 21 or the like, 18 a wiring pattern laid out on the package 17, 19a, 19b wire bonding for electrically connecting wiring patterns 19a, 19b to wiring patterns 11a, 11b, 20a lens placed between the LD element 12 and the optical fiber 21 to efficiently transmit front light emitted from the LD element 12, 21 an optical fiber for carrying front light emitted from the LD element 12, 22 a ferrule for securing the optical fiber 21, 23 a ferrule holder for holding the ferule 22, and 24 a hermetic window.

The operation of the first embodiment will then be described.

For example, in case the magnitude of front light emitted from the LD element 12 must be kept constant, observing back light emitted from the LD element 12 allows control of the LD element 12, as the magnitude of back light emitted from the LD element 12 is proportional to front light.

Figure 3:
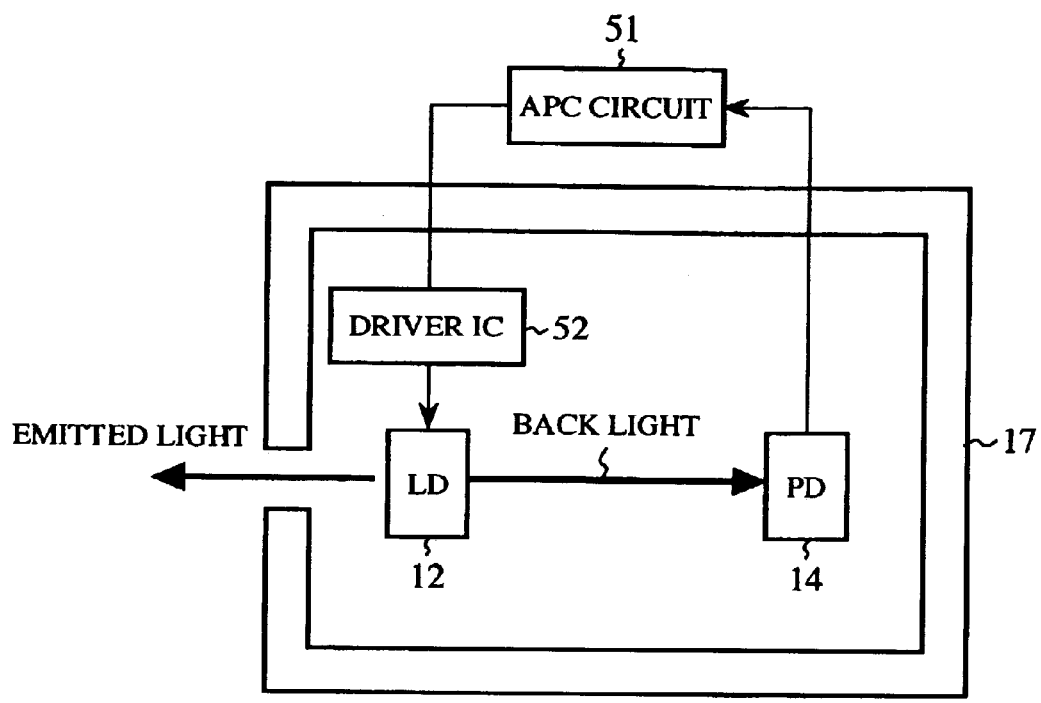
FIG. 3 is an explanatory view showing a concept of a PD monitor.

FIG. 3 is an explanatory view showing a concept of a PD monitor.

Specifically, as shown in FIG. 3, a circuit is designed in the following. When the PD element 14 detects back light emitted from the LD element 12, the PD element 14 outputs an electrical signal, whose magnitude is proportional to that of back light, to an external Automatic Power-Control (APC) circuit 51. Then, the APC circuit controls a light output level of the LD element 12 via a driver IC 52. For example, in case the magnitude of back light emitted from the LD element 12 is greater than that of the established one, a drive current for the LD element 12 is reduced so that the optical output level becomes small. Conversely, in case back light emitted from the LD element 12 is smaller than the established one, the drive current for the LD element 12 is reduced so that the light output level of the LD element 12 becomes large.

The driver IC 52 is sometimes provided outside of the package 17.

In the optical module of the first embodiment, in order for the PD element 14 to detect back light emitted from the LD element 12, the Pd element 14 stood on the dielectric substrate 11 such that the incident surface 14a of the PD element 14 faces to the back surface. Here, in order for the PD element 14 to surely detect back light, suppose that the dimension of the PD element 14 is set so that back light emitted from the LD element 12 impinges on the center of the incident surface 14a of the PD element 14.

To output electrical signals from the anode electrode 14b and the cathode electrode 14c of the PD element 14 to the APC circuit, and to secure the PD element 14 to the dielectric substrate 11, as shown in FIG. 2, the anode electrode 14b of the PD element 14 is electrically and mechanically connected to the wiring pattern 11a of the dielectric substrate 11 by the solder 15. Similarly, the cathode electrode 14c of the PD element 14 is electrically and mechanically connected to the wiring patterns 11b of the dielectric substrate 11 by the solder 16.

As can be seen form the above, according to the first embodiment, since there is provided the solder 15 which solders the anode electrode 14b of the PD element 14 for detecting back light emitted from the LD element 12 and the wiring patterns 11a, and the solder 16 which solders the cathode electrode 14c and the wiring patterns 11b, the PD element 14 can be mounted, without relying on the PD carrier. As a result, this obviates a wire bonding process for bonding the anode electrode 14b and the PD carrier, and a mounting process for the PD carrier, thus simplifying manufacturing processes.

In the first embodiment, as a conductive coupling member, the solders 15, 16 are adopted, but, needless to say, without being limited thereto, a conductive adhesive may be used, as an alternative, for example.

Also, in the first embodiment, the PD element 14 detects back light emitted from the LD element 12, but, as a matter of course, without being limited thereto, the LD element 14 may detect a part of front light emitted from the LD element 12.

Second Embodiment

In the first embodiment, the optical fiber 21 is secured to the package 17, but, as shown in FIG. 4, a receptacle (holding means) may be provided, as an alternative, in the package 17 for removably holding the ferrule 22 by which the optical fiber 21 is fixed. This connects and disconnects the optical fiber 21 to/from the optical fiber at need.

FIG. 4 is an overall block diagram showing an optical module according to the second embodiment of the present invention.

Referring to FIG. 4, reference numeral 27 denotes a space into which the ferrule 22 is inserted, 28 a hole with which an optical path is formed.

FIG. 5 is an overall block diagram showing an optical module according to the second embodiment.

Referring to FIG. 5, reference numeral 5 denotes a sealing compound.

Also, in the first embodiment, the lens 20 is placed between the LD element 12 and the optical fiber 21. However, as shown in FIG. 5, the lens 20 is not mandatory.

Third Embodiment

Figure 6:
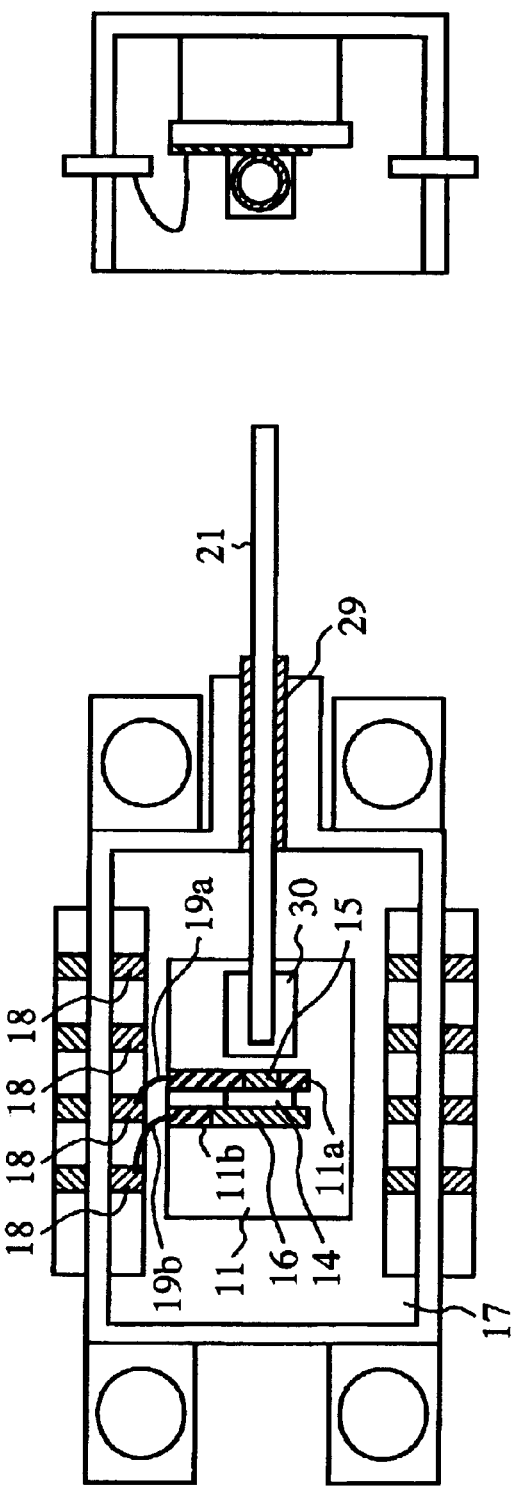
FIG. 6 is an overall block diagram showing an optical module according to a third embodiment of the present invention.
Figure 7A:
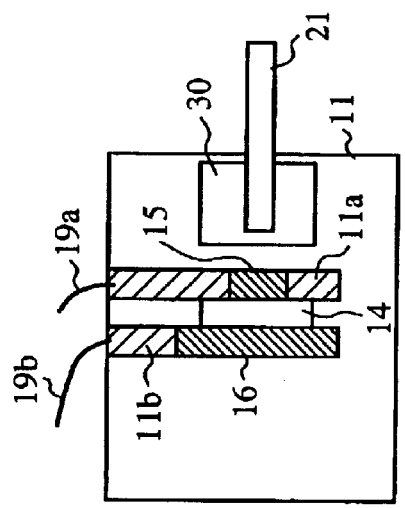
FIG. 7A is a top view showing a purview of an optical module according to a third embodiment.
Figure 7D:
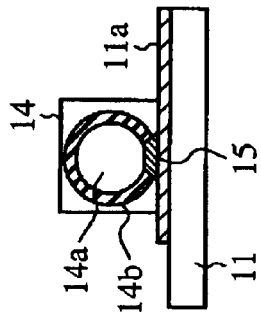
FIG. 7D is a front view showing a PD element.
Figure 7C:
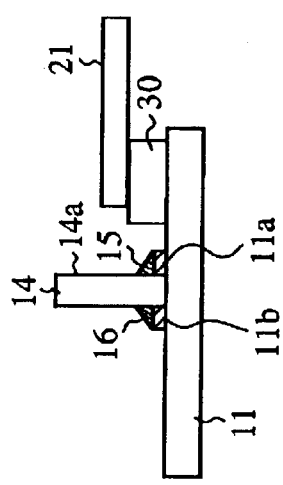
FIG. 7C is a side view showing a purview of an optical module.
Figure 7B:
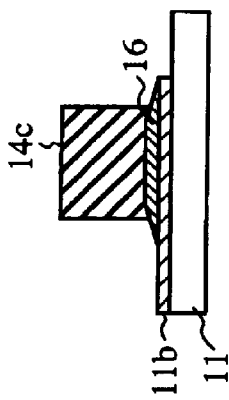
FIG. 7B is a rear view showing a PD element.

FIG. 6 is an overall block diagram showing an optical module according the third embodiment of the present invention. FIG. 7A is a top view showing a purview of an optical module according to the third embodiment. FIG. 7B is a rear view showing a PD element. FIG. 7C is a side view showing a purview of an optical module. FIG. 7D is a front view showing a PD element. IN FIG. 6, FIGS. 7A through 7D, the same reference numerals as those in FIGS. 2, 5 indicate identical or equivalent parts and therefore descriptions thereof are omitted for brevity s sake. Referring to FIG. 6, FIGS. 7A through 7B, reference numeral 30 denotes an optical fiber carrier for holding thereon the optical fiber.

The operation of the third embodiment will then be described.

In the first embodiment, the PD element 14 detects front light or back light emitted from the LD element 12. Alternatively, when the optical module is not used as a PD module but as a PD monitor, the PD module 14 may detect emitted light from the optical fiber 21.

Other than the above is the same as the first embodiment and therefore descriptions thereof are omitted for brevity s sake.

Fourth Embodiment

Figure 9:
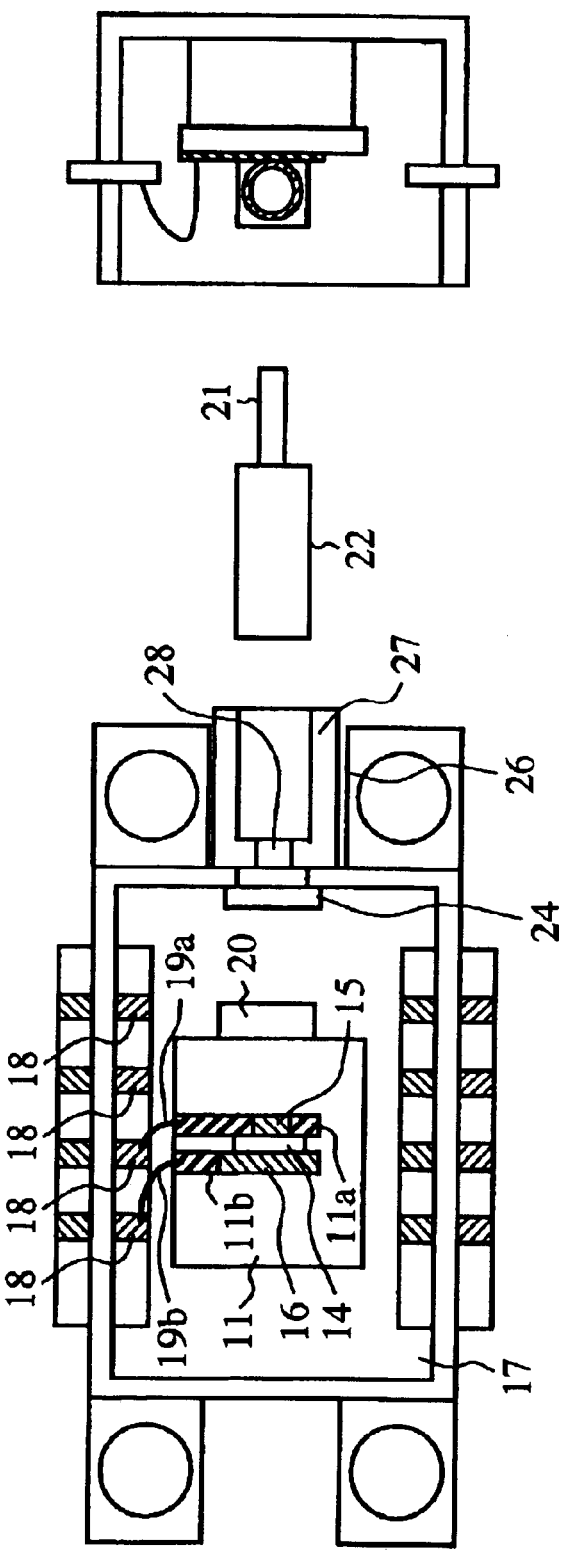
FIG. 9 is an overall block diagram showing an optical module according to a fourth embodiment.
Figure 13A:
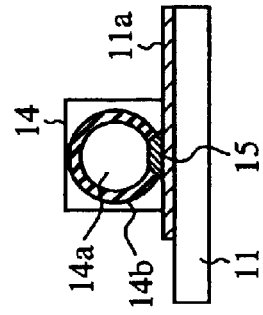
FIG. 13A is a top view showing a purview of an optical module according to a sixth embodiment of the present invention.
Figure 13C:
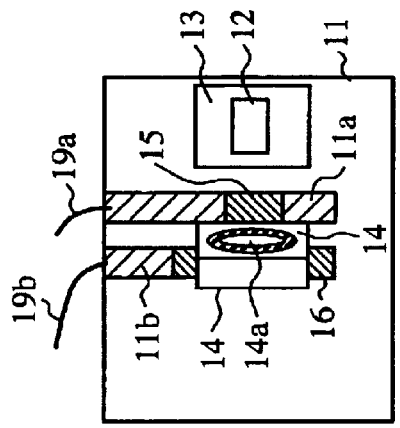
FIG. 13C is a side view showing a purview of an optical module.
Figure 13D:
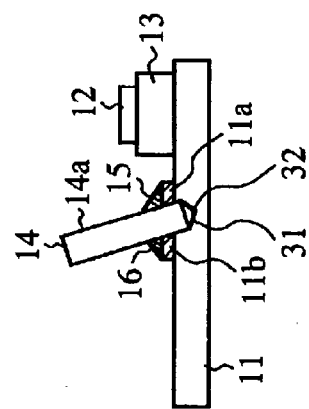
FIG. 13D is a front view showing a PD element.
Figure 13B:
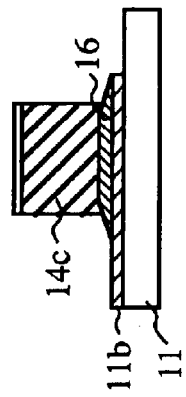
FIG. 13B is a rear view showing a PD element.
Figure 17A:
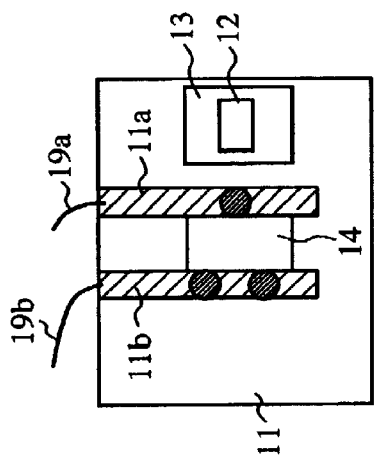
FIG. 17A is a top view showing a purview of an optical module according to a tenth embodiment of the present invention.
Figure 17D:
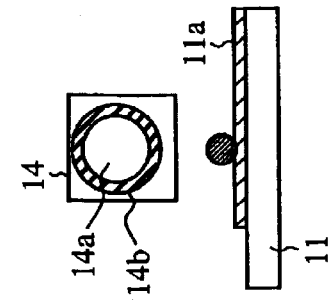
FIG. 17D is a front view showing a PD element.
Figure 17C:
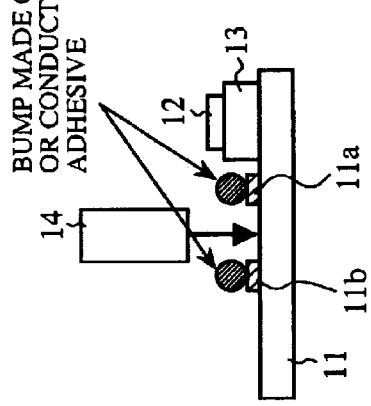
FIG. 17C is a side view showing a purview of an optical module.
Figure 17B:
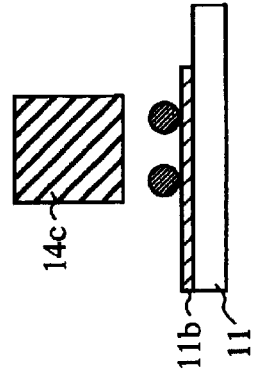
FIG. 17B is a rear view showing a PD element.
Figure 18A:
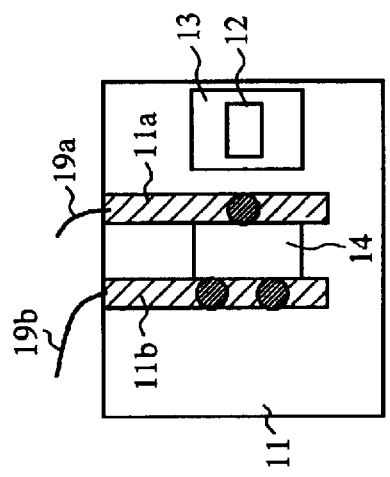
FIG. 18A is a top view showing a purview of an optical module according to a tenth embodiment.
Figure 18D:
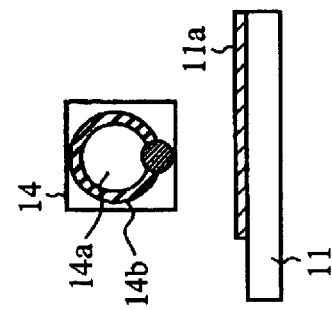
FIG. 18D is a front view showing a PD element.
Figure 18C:
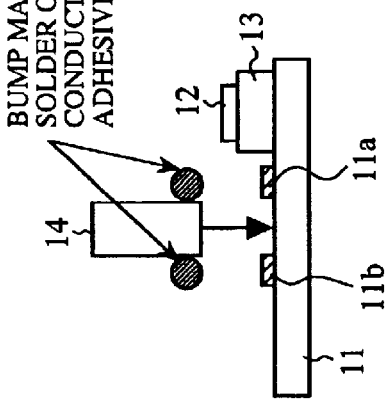
FIG. 18C is a side view showing a purview of an optical module.
Figure 18B:
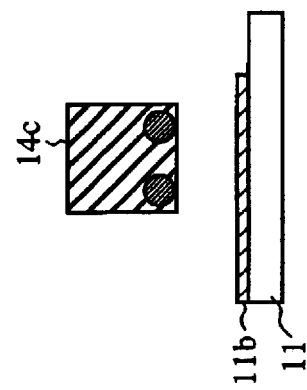
FIG. 18B is a rear view showing a PD element.

FIG. 8 is an overall block diagram showing an optical module according to the fourth embodiment of the present invention. FIG. 9 is an overall block diagram showing an optical module according to the fourth embodiment.

In the third embodiment, the lens is not placed between the optical fiber 21 and the PD element 14. However, for more efficient transmission of emitted light from the optical fiber 21, as shown in FIG. 8, the lens 20 may be placed between the optical fiber 21 and the PD element 15.

Also, in the third embodiment, the optical fiber 21 is secured to the package 17. Alternatively, as shown in FIG. 9, a receptacle 26 may be provided for removably holding the ferrule 22 by which the optical fiber 21 is fixed. This gives freedom to connect and disconnect the optical fiber 21 to/from the optical module at need.

Fifth Embodiment

FIG. 10A is a top view showing a purview of an optical module according to the fifth embodiment. FIG. 10B is a rear view showing a PD element. FIG. 10C is a side view showing a purview of an optical module. FIG. 10D is a front view showing a PD element. In FIGS. 10A through 10D, the same reference numerals as those in FIG. 2 indicate identical or equivalent parts and therefore descriptions thereof are omitted for brevity s sake.

Referring to FIGS. 10A through 10D, reference numeral 31 denotes a slit into which a part of the PD element 14 is inserted, and which is formed in V-shape. Reference numeral 32 denotes a clearance between the PD element 14 and the dielectric substrate 11, which is created when the PD element 14 is inserted into the slit 31.

The operation of the fifth embodiment will then be described.

In the first through fourth embodiments, the PD element 14 stood on the dielectric substrate 11 without forming a slit on the dielectric substrate 11. In this event, in case the PD element 14 is not held by a jig, it would be difficult to stand the PD element 14, in pouring the solders 15, 16 or the conductive adhesive into the slit.

Accordingly, in the fifth embodiment, the slit 31 into which a part of the PD element 14 is inserted is formed on the substrate 11 so as to stand the PD element 14 in the slit 31, in pouring the solders 15, 16 or the conductive adhesive into the slit.

Here, assume that the depth of the slit is established such that back light emitted from the LD element 12 impinges on the center of the incident surface 14a of the PD element 14. This simplifies a bonding process for The PD element 14 by the solders 15, 16 or the conductive adhesive.

In the fifth embodiment, the slit 31 is formed in V-shape. Thus, when the PD element 14 is inserted into the slit 31, a clearance 32 is created between the PD element 14 and the dielectric substrate 11.

Figure 11:
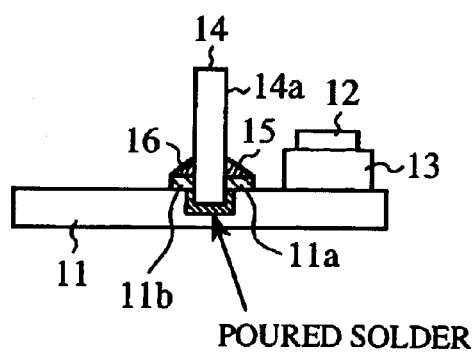
FIG. 11 is an explanatory view explaining capillarity.

Unfortunately, in case this clearance 32 is not created between them for some reason, as shown in FIG. 11, as a cause, the solder 15, 16 may perhaps be poured between the PD element 14 and the dielectric substrate 11 from capillarity, which causes short-circuiting between the anode electrode 14b and the cathode electrode 14c.

In case the clearance 32 is created between them without arising any trouble, the solders 15, 16 do not pour into the base of the PD element 14 anymore from capillarity, which frees from danger of the short-circuiting between the anode electrode 14b and the cathode electrode 14c.

In the fifth embodiment, the slit 31 is formed in V-shape, but, needless to say, without being limited thereto, the slit 31 may be formed in U-shape, as an alternative, for example.

Sixth Embodiment

In the first through fifth embodiments, the PD element 14 stood on the dielectric substrate 11 such that the incident surface 14a of the PD element 14 faces to the back of the LD element 12 or the optical fiber 21. Alternatively, as shown in FIG. 12 or 13, the incident surface 14a of the PD element 14 may stand on the slant relative to the back of the LD element 12 or the optical fiber 21. The slant angle of the PD element 14 is not limited to any specific one. Generally, it is within the range from 0° to 20°, preferably, from 4° to 12°. This reduces the amount of light reflected from the incident surface 14a of the PD element 14 to the LD element 12.

Seventh Embodiment

In the sixth embodiment, the incident surface 14a of the PD element 14 stood on the slant relative to the back of the LD element 12 or the optical fiber 21. Alternatively, in forming the slit 31 on the slant relative to the dielectric substrate 11, as shown in FIG. 14, slits whose center of grooves are shifted in stages may be formed on the dielectric substrate 11.

When grooves are formed with a dicer or the like to mount the PD element 14 on the slant, it becomes difficult to manufacture a dielectric substrate 11 having repeatedly formed grooves, thus precluding manufacturing of a large substrate by one working process in the manufacturing process.

However, if grooves are formed with etching and the grooves are shifted in stages, the PD element 14 will be able successfully to not only mount it on the slant but also manufacture the dielectric substrate 11 having repeatedly formed grooves in the working process. This permits manufacturing of the large substrate by one working process.

Eighth Embodiment

In the sixth embodiment, the incident surface 14a of the PD element 14 stood relative to the back of the LD element 12 or the optical fiber 21. Alternatively, as shown in FIG. 15, two grooves may be formed on the surface of the dielectric substrate 11 with which the PD element 12 is contacted. This prevents from short-circuiting between the anode electrode 14b and the cathode electrode 14c.

Ninth Embodiment

Although, no particular reference is made in the first through eighth embodiments, the height of the PD element 14 may be set to be smaller than twice of the width T thereof.

That is, as shown in FIG. 1, the dimensions of the PD element 14 are designed such that the relationship T>H/2 is satisfied, where, T=200 μm, H=300 μm, for example. This helps easy standing of the PD element 14, in bonding the PD element 14 on the dielectric substrate 11.

Tenth Embodiment

In the first through ninth embodiments, no a particular reference is made to a bonding method with the solder or the conductive adhesive. Instead of pouring the solder or conductive adhesive, as shown in FIG. 17, after the PD element 14 has stood on the dielectric substrate 11, a bump made of solder or conductive adhesive may be previously formed to mount it on the wiring patterns 11a, 11b, and in turn the PD element 14 may be mounted thereon. This promotes easy bonding of the PD element 14 on the dielectric substrate 11.

Also, as shown in FIG. 18, a bump made of solder or conductive adhesive may be previously formed to adhere to the anode electrode 14b and the cathode electrode 14c of the PD element 14. Thereafter, the PD element 14 may be mounted on the dielectric substrate 11.

Eleventh Embodiment

In the first through tenth embodiments, no a particular reference is made, the incident surface 14a of the PD element 14 is formed by p layer, the back n layer, and an intermediate layer between the incident surface 14a and the back i layer.

As mentioned above, when the solder is poured between the PD element 14 and the dielectric substrate 11, the P layer is electrically connected to the n layer, with short-circuiting being occurred between the anode electrode 14b and the cathode electrode 14c.

Figure 19A:
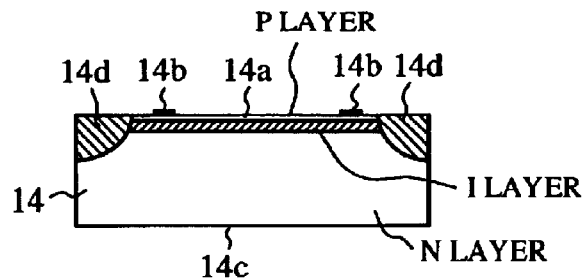
FIG. 19A is a sectional view showing a cross section of a PD element of an optical module according to an eleventh embodiment of the present invention.
Figure 19B:
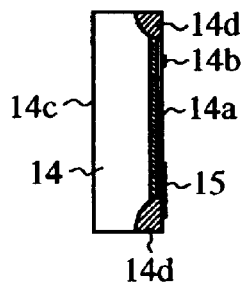
FIG. 19B is a side view showing a PD element.
Figure 19C:
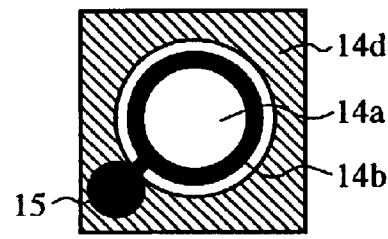
FIG. 19C is a front view showing a PD element.

To avoid this, in the eleventh embodiment, as shown in FIG. 19, a PD element is formed, in which an insulating layer 14d is embedded into the periphery of the incident surface 14a. As an insulating material, polyimide or Fe doped InP is advisable. This prevents from short-circuiting between the anode electrode 14b and the cathode electrode 14c by doing away with pn connection, as the insulating layer 14b is embedded into the mounting surface of the dielectric substrate 11 on which the PD element 14 is to be mounted, even if the solder 15, 16 are poured between the PD element 14 and the dielectric substrate 11 from capillarity.

Twelfth Embodiment

Figure 20A:
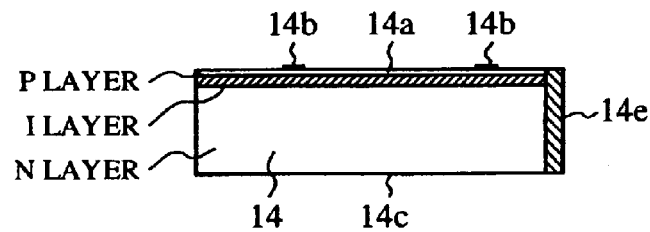
FIG. 20A is a sectional view showing a cross section of a PD element of an optical module according to a twelfth embodiment of the present invention.
Figure 20B:
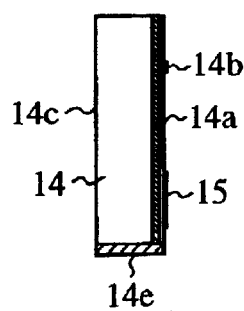
FIG. 20B is a side view showing a PD element.
Figure 20C:
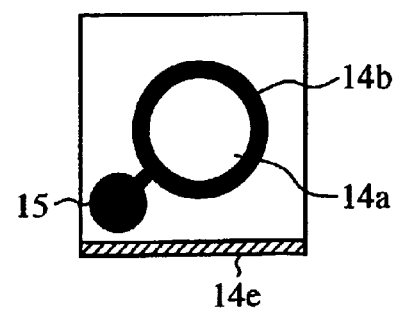
FIG. 20C is a front view showing a PD element.

In the eleventh embodiment, the PD element 14 in which the insulating layer 14d is embedded into the periphery of the incident surface 14a, but, as shown in FIG. 20, an insulating layer 14e is formed on the mounting surface of the dielectric substrate 11 on which the PD element 14 is to be mounted.

That is, the insulating layer 14e is formed on the mounting surface on which the PD element 14 is to be mounted in AR coat or HR coat manner. As an insulating layer, $S_iO_2$ used for AR coat is desirable, for example. This exerts same effect as the eleventh embodiment.

Thirteenth Embodiment

In the first through twelfth embodiments, both electrodes are electrically connected to the wiring patterns 11a, 11b with the solder or the conductive adhesive, but, one electrode may be connected to the wiring patterns without relying on the solder or the conductive adhesive.

Figure 21A:
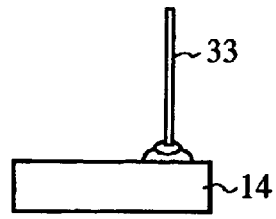
FIG. 21A is a sectional view showing a PD element of an optical module according to a thirteenth embodiment of the present invention.
Figure 21B:
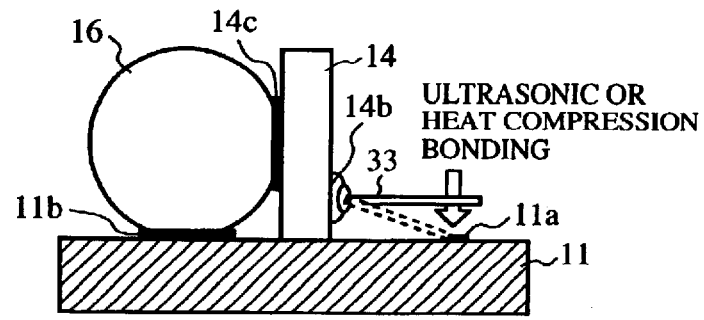
FIG. 21B is s side view showing a purview of an optical module.
Figure 22:
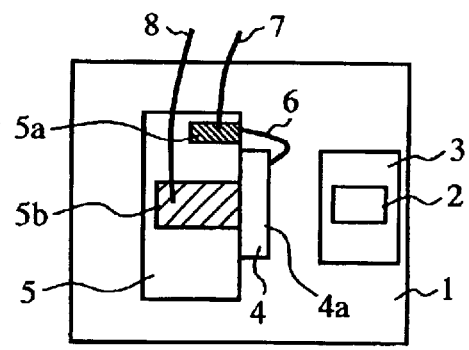
FIG. 22A is a top view showing a conventional optical module.
FIG. 22B is a side view showing a conventional optical module.
FIG. 22C is a front view showing a PD element.
Figure 22B:
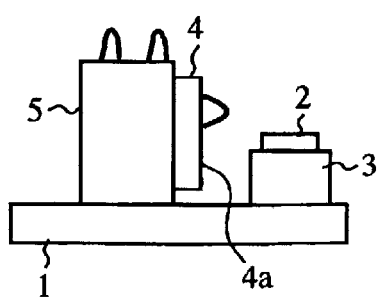
Figure 22C:
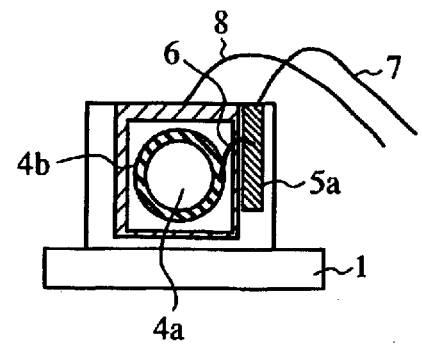

Specifically, as shown in FIG. 21, the PD element to which a wire 33 is previously attached is provided at the anode electrode 14b. The previous lay out of the wire 33 is carried out in the fashion of wire bonding and then wire is cut by torch and the like.

A big solder bole is put on the back of the PD element 14 to thereby electrically connect the cathode electrode 14c to the wiring patterns 11b. On the other hand, at the incident surface of the PD element 14, by applying microwave or heat to the wire 33 the wire 33 is compression bonded on the wiring patterns 11a to electrically connect the anode electrode 14b to the wiring patterns 11a.

While, in the preferred embodiments of the invention, the optical module is given, it should be understood by those skilled in the art that various modifications and changes may be made without departing from the sprit and scope of the invention.

Also, it should be noted that the invention meets all the objects mentioned above and also has the advantages of wide commercial utility, and that the invention has been set forth for purposes of illustration only and not of limitation. That is, the invention is limited only by the following claims which follow. Consequently, reference should be made to the following claims in determining the full scope of the invention.

What is claimed is:

1. An optical module, comprising:
   a base on which wiring patterns are laid out;
   a photo detector outputting an electrical signal, having a pair of metal layers and a circumferential surface which is substantially perpendicular in the extending direction of these metal layers, standing on the base with a part of the circumferential surface thereof contacted with the base, for detecting emitted light from a radiative device; and
   a conductive coupling member for electrically coupling an electrode of the photo detector to the wiring patterns, and for securing the photo detector to the base.

2. The optical module according to claim 1, wherein the dimension of the photo detector is set such that the intensity center of the emitted light substantially coincides with the center of the photo incident surface of the photo detector.

3. The optical module according claim 1, wherein a slit for inputting therein a part of the photo detectors is formed on the base.

4. The optical module according to claim 3, wherein the slit is formed in U-shape.

5. The optical module according to claim 3, wherein the slit is formed in V-shape.

6. The optical module according to claim 3, wherein the depth of the slit is set such that the emitted light impinges on the center of the photo incident surface of the photo detector.

7. The optical module according to claim 1, wherein the photo incident surface of the photo detector stood on the slant relative to the emitted light.

8. The optical module according to claim 7, wherein a stepwise slit whose center line is shifted in stages is formed on the base and a part of the photo detectors is inserted into the slit.

9. The optical module according to claim 7, wherein two grooves are formed on the base on which the photo detector which is to be mounted.

10. The optical module according to claim 1, wherein the height of the photo detector is set to be smaller than twice of the width of the circumferential surface of the photo detector.

11. The optical module according to claim 1, wherein an insulating layer is formed on the outer periphery of the incident surface of the photo detector.

12. The optical module according to claim 1, wherein an insulating layer is applied to the circumferential surface of the photo detector which is contacted with the base.

13. The optical module according to claim 1, wherein a wire is connected to the wiring patterns when the wire is provided on either of the metal layers of the photo detectors.

14. An optical module, comprising:
a base on which wiring patterns are laid out;
a photo detector outputting an electrical signal, having a pair of metal layers and a circumferential surface which is substantially perpendicular in the extending direction of these metal layers, standing on the base with a part of the circumferential surface thereof contacted with the base, for detecting emitted light from an optical fiber; and
a dielectric coupling member for electrically coupling an electrode of the photo detector to the wiring patterns, and for securing the photo detector to the base.

15. An optical module comprising:
a base on which wiring patterns are laid out;
a photo detector outputting an electrical signal, having a pair of metal layers and a circumferential surface which is substantially perpendicular in the extending direction of these metal layers, standing on the base with a part of the circumferential surface thereof contacted with the base, for detecting emitted light from a radiative device; and
solder for soldering the electrode of the photo detector and the wiring patterns.

16. An optical module, comprising:
a base on which wiring patterns are laid out;
a photo detector outputting an electrical signal, having a pair of metal layers and a circumferential surface which is substantially perpendicular in the extending direction of these metal layers, standing on the base with a part of the circumferential surface thereof contacted with the base, for detecting emitted light from an optical fiber; and
solder for soldering the electrode of the photo detector and the wiring patterns.

17. An optical module, comprising:
a base on which wiring patterns are laid out;
a photo detector outputting an electrical signal, having a pair of metal layers and a circumferential surface which is substantially perpendicular in the extending direction of these metal layers, standing on the base with a part of the circumferential surface thereof contacted with the base, for detecting emitted light from an optical fiber; and
a dielectric adhesive for adhering the electrode of the photo detector to the wiring patterns.

18. An optical module, comprising:
a base on which wiring patterns are laid out;
a photo detector outputting an electrical signal, having a pair of metal layers and a circumferential surface which is substantially perpendicular in the extending direction of these metal layers, standing on the base with a part of the circumferential surface thereof contacted with the base, for detecting emitted light from a radiation device; and
a dielectric adhesive for adhering the electrode of the photo detector to the wiring patterns.

19. An optical module, comprising:
a base on which wiring patterns are laid out;
a radiative device mounted on the base with a part of the circumferential surface thereof contacted with the base,
an optical fiber for carrying emitted light from the radiative device,
a photo detector outputting an electrical signal, having a pair of metal layers and a circumferential surface which is substantially perpendicular in the extending direction of these metal layers, standing on the base with a part of the circumferential surface thereof contacted with the base, for detecting emitted light from the radiative device,
a dielectric coupling member for electrically coupling the electrodes of the photo detector to the wiring patterns, and for securing the photo detector to the base; and
a package for holding thereon the base and the optical fiber.

20. An optical module according to claim 19, wherein holding means for removably holding the optical fiber is provided in the package.

21. A optical module according to claim 19, wherein a lens is placed between the radiative device and the optical fiber.

22. An optical module, comprising:
a base on which wiring patterns are laid out;
a photo detector outputting an electrical signal, having a pair of metal layers and a circumferential surface which is substantially perpendicular in the extending direction of these metal layers, standing on the base with a part of the circumferential surface thereof contacted with the base, for detecting emitted light from an optical fiber,
a dielectric coupling member for electrically coupling the electrode of the photo detector to the wiring patterns, and for securing the photo detector to the base; and
a package for holding thereon the base and the optical fiber.

23. An optical module according to claim 22, wherein a lens is placed between the optical fiber and the photo detector.

* * * * *

UNITED STATES PATENT AND TRADEMARK OFFICE
CERTIFICATE OF CORRECTION

PATENT NO. : 7,165,897 B2
APPLICATION NO. : 10/327928
DATED : January 23, 2007
INVENTOR(S) : Shinichi Takagi It is certified that error appears in the above-identified patent and that said Letters Patent is hereby corrected as shown below:

Column 10, claim 1, line 33, delete "circumferential" and insert therefore --light receiving--; delete "which"; and insert --standing--;

line 34, delete "is"; and after "perpendicular" insert --to the base--;

line 35, delete "standing on the base with";

line 36, delete "circumferential" and insert therefore --light receiving--.

Column 11, claim 14, line 13, delete "circumferential" and insert therefore --light receiving--; delete "which"; and insert --standing--;

line 14, delete "is"; and after "perpendicular" insert --to the base--;

line 15, delete "standing on the base with";

line 16, delete "circumferential" and insert therefore --light receiving--;

line 19, delete "dielectric" and insert therefore --conductive--.

Column 11, claim 15, line 25, delete "circumferential" and insert therefore --light receiving--; delete "which"; and insert --standing--;

line 26, delete "is"; and after "perpendicular" insert --to the base--;

line 27, delete "standing on the base with";

line 28, delete "circumferential" and insert therefore --light receiving--.

Column 11, claim 16, line 36, delete "circumferential" and insert therefore --light receiving--; delete "which"; and insert --standing--;

line 37, delete "is; and after "perpendicular" insert --to the base--;

line 38, delete "standing on the base with";

line 39, delete "circumferential" and insert therefore --light receiving--.

UNITED STATES PATENT AND TRADEMARK OFFICE
CERTIFICATE OF CORRECTION

PATENT NO. : 7,165,897 B2
APPLICATION NO. : 10/327928
DATED : January 23, 2007
INVENTOR(S) : Shinichi Takagi It is certified that error appears in the above-identified patent and that said Letters Patent is hereby corrected as shown below:

Column 11, claim 17, line 47, delete "circumferential" and insert therefore --light receiving--; delete "which"; and insert --standing--;

line 48, delete "is"; and after "perpendicular" insert --to the base--;

line 49, delete "standing on the base with";

line 50, delete "circumferential" and insert therefore --light receiving--;

line 53, delete "dielectric" and insert therefore --conductive--.

Column 12, claim 18, line 4, delete "circumferential" and insert therefore --light receiving--; delete "which"; and insert --standing--;

line 5, delete "is"; and after "perpendicular" insert --to the base--;

line 6, delete "standing on the base with";

line 7, delete "circumferential" and insert therefore --light receiving--;

line 10, delete "dielectric" and insert therefore --conductive--.

Column 12, claim 19, line 19, delete "circumferential" and insert therefore --light receiving--; delete "which"; and insert --standing--;

line 20, delete "is"; and after "perpendicular" insert --to the base--;

line 21, delete "standing on the base with";

line 22, delete "circumferential" and insert therefore --light receiving--;

line 25, delete "dielectric" and insert therefore --conductive--.

UNITED STATES PATENT AND TRADEMARK OFFICE
CERTIFICATE OF CORRECTION

PATENT NO. : 7,165,897 B2
APPLICATION NO. : 10/327928
DATED : January 23, 2007
INVENTOR(S) : Shinichi Takagi It is certified that error appears in the above-identified patent and that said Letters Patent is hereby corrected as shown below:

Column 12, claim 22, line 39, delete "circumferential" and insert therefore --light receiving--; delete "which"; and insert --standing--;

line 40, delete "is"; and after "perpendicular" insert --to the base--;

line 41, delete "standing on the base with";

line 42, delete "circumferential" and insert therefore --light receiving--;

line 45, delete "dielectric" and insert therefore --conductive--.

Signed and Sealed this

Twelfth Day of June, 2007

JON W. DUDAS
*Director of the United States Patent and Trademark Office*